(12) United States Patent
Lee et al.

(10) Patent No.: US 11,127,786 B2
(45) Date of Patent: Sep. 21, 2021

(54) MAGNETIC MEMORY DEVICE

(71) Applicant: Samsung Electronics Co., Ltd., Suwon-si (KR)

(72) Inventors: Joonmyoung Lee, Anyang-si (KR); Whankyun Kim, Seoul (KR); Jeong-Heon Park, Hwaseong-si (KR); Woo Chang Lim, Sungnam-si (KR); Junho Jeong, Hwaseong-si (KR)

(73) Assignees: SAMSUNG ELECTRONICS CO., LTD., Suwon-si (KR); I, Gyeonggi-do (KR)

( * ) Notice: Subject to any disclaimer, the term of this patent is extended or adjusted under 35 U.S.C. 154(b) by 39 days.

(21) Appl. No.: 16/556,599

(22) Filed: Aug. 30, 2019

(65) Prior Publication Data

US 2020/0243603 A1 Jul. 30, 2020

(30) Foreign Application Priority Data

Jan. 28, 2019 (KR) .......................... 10-2019-0010325

(51) Int. Cl.
*H01L 27/22* (2006.01)
*G11C 11/16* (2006.01)
*H01L 43/02* (2006.01)
*H01F 10/32* (2006.01)
*H01L 43/10* (2006.01)

(52) U.S. Cl.
CPC .......... *H01L 27/224* (2013.01); *G11C 11/161* (2013.01); *H01F 10/329* (2013.01); *H01L 43/02* (2013.01); *G11C 11/1673* (2013.01); *G11C 11/1675* (2013.01); *H01F 10/3286* (2013.01); *H01L 43/10* (2013.01)

(58) Field of Classification Search
CPC ..... H01F 10/3286; H01F 10/329; H01L 43/08
See application file for complete search history.

(56) References Cited

U.S. PATENT DOCUMENTS

| 9,384,812 | B2 | 7/2016 | Wu et al. |
| 9,460,768 | B2 | 10/2016 | Manipatruni et al. |
| 9,837,602 | B2 | 12/2017 | Braganca |
| 9,858,975 | B1 | 1/2018 | Hatcher |
| 10,079,057 | B2 | 9/2018 | Ozbay et al. |
| 2014/0312441 | A1* | 10/2014 | Guo ............... H01L 27/228 257/427 |
| 2017/0117027 | A1 | 4/2017 | Braganca et al. |
| 2017/0148978 | A1 | 5/2017 | Apalkov et al. |
| 2017/0162246 | A1 | 6/2017 | Khvalkovskiy et al. |
| 2018/0040807 | A1 | 2/2018 | Saito et al. |

(Continued)

FOREIGN PATENT DOCUMENTS

| KR | 10-1864028 B1 | 6/2018 |
| KR | 10-2020-0030277 A | 3/2020 |

Primary Examiner — Dale E Page
Assistant Examiner — Wilner Jean Baptiste
(74) Attorney, Agent, or Firm — Muir Patent Law, PLLC

(57) ABSTRACT

Disclosed is a magnetic memory device including a line pattern on a substrate, a magnetic tunnel junction pattern on the line pattern, and an upper conductive line that is spaced apart from the line pattern across the magnetic tunnel junction pattern and is connected to the magnetic tunnel junction pattern. The line pattern provides the magnetic tunnel junction pattern with spin-orbit torque. The line pattern includes a chalcogen-based topological insulator.

17 Claims, 6 Drawing Sheets

(56) References Cited

U.S. PATENT DOCUMENTS

| | | | |
|---|---|---|---|
| 2018/0151798 A1* | 5/2018 | Pandey | H01L 43/10 |
| 2018/0166197 A1 | 6/2018 | Wang et al. | |
| 2018/0166500 A1 | 6/2018 | Wang et al. | |
| 2018/0358555 A1* | 12/2018 | Lee | G11C 11/1655 |
| 2018/0366171 A1* | 12/2018 | Li | G11C 11/1673 |
| 2019/0259810 A1* | 8/2019 | Jacob | H01L 27/228 |

* cited by examiner

MAGNETIC MEMORY DEVICE

CROSS-REFERENCE TO RELATED APPLICATION

This U.S. nonprovisional application claims priority under 35 U.S.C § 119 to Korean Patent Application No. 10-2019-0010325 filed on Jan. 28, 2019 in the Korean Intellectual Property Office, the entire contents of which are hereby incorporated by reference.

BACKGROUND

The present inventive concepts relate to a magnetic memory device including a magnetic tunnel junction.

As electronic products demand high speed and/or low power consumption, magnetic memory devices with high speed and low operating voltages have been developed as semiconductor memory devices. Because magnetic memory devices operate at high speeds and have nonvolatile characteristics, they have attracted considerable attention as the next-generation semiconductor memory devices.

In general, the magnetic memory device may include a magnetic tunnel junction (MTJ). The magnetic tunnel junction may include two magnetic structures and a dielectric layer interposed therebetween. The resistance of the magnetic tunnel junction varies depending on magnetization directions of the two magnetic structures. For example, the magnetic tunnel junction has high resistance when the magnetization directions of the two magnetic structures are anti-parallel and low resistance when the magnetization directions of the two magnetic structures are parallel. The magnetic memory device may write and read data using the resistance difference between the high and low resistances of the magnetic tunnel junction. With the marked advance in electronic industry, there is an increasing demand for high integration and/or low power consumption of magnetic memory devices. Accordingly, many studies have been conducted to meet these demands.

SUMMARY

Some example embodiments of the present inventive concepts provide a spin-orbit torque based magnetic memory device capable of high integration and a method of fabricating the same. The present inventive concepts are not limited to that mentioned above.

According to some example embodiments of the present inventive concepts, a magnetic memory device includes a first line pattern on a substrate, a first magnetic tunnel junction pattern on the first line pattern, and a first upper conductive line that is spaced apart from the first line pattern across the first magnetic tunnel junction pattern and is connected to the first magnetic tunnel junction pattern. The first line pattern provides the first magnetic tunnel junction pattern with spin-orbit torque. The first line pattern includes a chalcogen-based topological insulator.

According to some example embodiments of the present inventive concepts, a magnetic memory device includes a first magnetic tunnel junction pattern and a second magnetic tunnel junction pattern sequentially stacked on a substrate, a line pattern between the first magnetic tunnel junction pattern and the second magnetic tunnel junction pattern, and a first upper conductive line that is between the first magnetic tunnel junction pattern and the line pattern and is connected to the first magnetic tunnel junction pattern. The line pattern provides the second magnetic tunnel junction pattern with spin-orbit torque and electrically insulates the first upper conductive line from the second magnetic tunnel junction pattern depending on a voltage applied to the line pattern.

According to some example embodiments of the present inventive concepts, a magnetic memory device includes a line pattern on a substrate, and a magnetic tunnel junction pattern on the line pattern. The line pattern has Ovonic threshold switching characteristics to be in one of a conducting state and an insulating state according to a voltage applied to the line pattern.

DETAILED DESCRIPTION OF EMBODIMENTS

The following will now describe in detail some example embodiments of the present inventive concepts with reference to the accompanying drawings.

Figure 1:
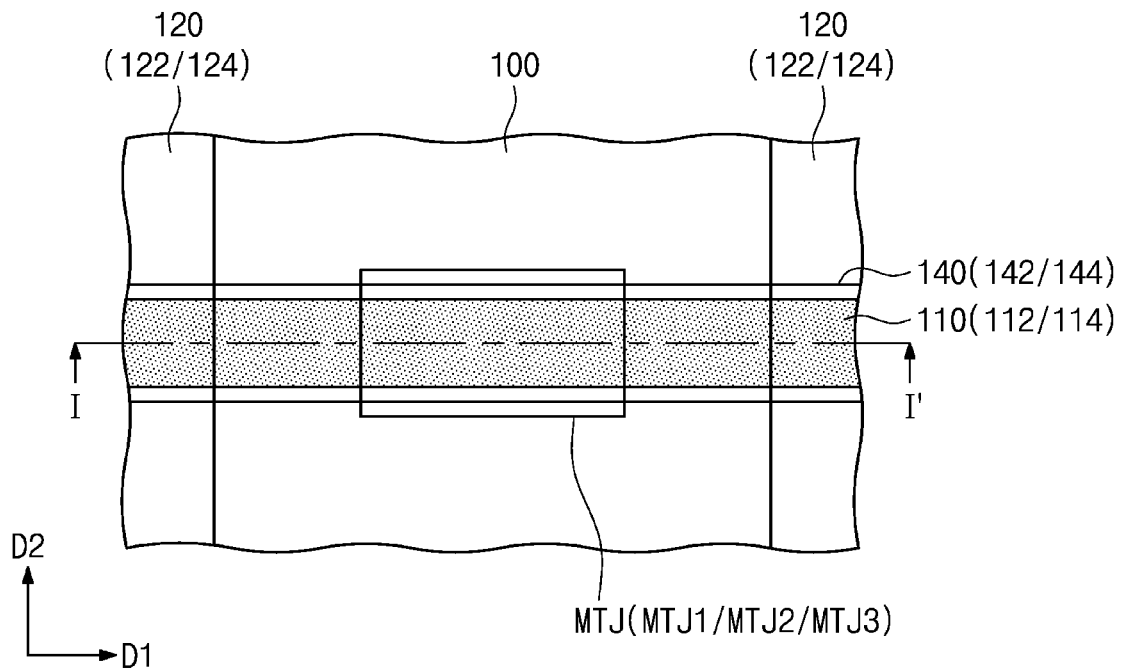
FIG. 1 illustrates a plan view showing a magnetic memory device according to some example embodiments of the present inventive concepts.
Figure 2:
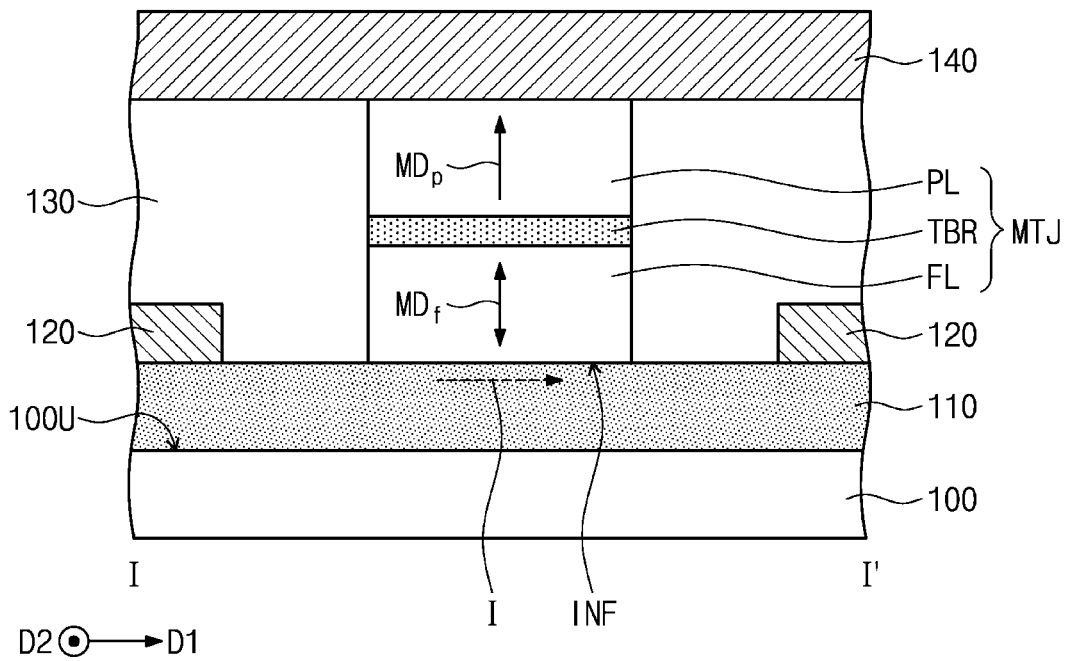
FIG. 2 illustrates a cross-sectional view taken along line I-I' of FIG. 1.

FIG. 1 illustrates a plan view showing a magnetic memory device according to some example embodiments of the present inventive concepts. FIG. 2 illustrates a cross-sectional view taken along line I-I' of FIG. 1.

Referring to FIGS. 1 and 2, a line pattern 110 may be disposed on a substrate 100, and a magnetic tunnel junction pattern MTJ may be disposed on the line pattern 110. The substrate 100 may include a semiconductor substrate. In an example embodiment, the substrate 100 may further include at least one conductive layer and/or at least one dielectric layer formed on the semiconductor substrate. The semiconductor substrate may include silicon, silicon-on-insulator (SOI), silicon-germanium (SiGe), germanium (Ge), gallium-arsenic (GaAs), etc.

The magnetic tunnel junction pattern MTJ may include a reference magnetic pattern PL, a free magnetic pattern FL, and a tunnel barrier pattern TBR between the reference magnetic pattern PL and the free magnetic pattern FL. In certain embodiments, the free magnetic pattern FL may be disposed between the line pattern 110 and the tunnel barrier pattern TBR, and the reference magnetic pattern PL may be spaced apart from the free magnetic pattern FL across the tunnel barrier pattern TBR. For example, the free magnetic pattern FL may be closer than the reference magnetic pattern PL to the line pattern 110. In other embodiments, differently from that shown, the reference magnetic pattern PL may be disposed between the line pattern 110 and the tunnel barrier pattern TBR, and the free magnetic pattern FL may be spaced apart from the reference magnetic pattern PL across the tunnel barrier pattern TBR. For example, the reference magnetic pattern PL may be closer than the free magnetic pattern FL to the line pattern 110. The tunnel barrier pattern TBR may include one or more of a magnesium (Mg) oxide layer, a titanium (Ti) oxide layer, an aluminum (Al) oxide layer, a magnesium-zinc (Mg—Zn) oxide layer, and a magnesium-boron (Mg—B) oxide layer. Each of the reference magnetic pattern PL and the free magnetic pattern FL may include at least one magnetic layer.

The reference magnetic pattern PL may include a reference layer having a magnetization direction MDp fixed in a single direction. The free magnetic pattern FL may include a free layer having a magnetization direction MDf switchable to be oriented either parallel or anti-parallel to the magnetization direction MDp of the reference magnetic pattern PL. The magnetization directions MDp and MDf of the reference magnetic pattern PL and the free magnetic pattern FL may be substantially perpendicular to an interface between the tunnel barrier pattern TBR and the free magnetic pattern FL. In this case, each of the reference magnetic pattern PL and the free magnetic pattern FL may include one or more of an intrinsic perpendicular magnetization material and an extrinsic perpendicular magnetization material. The intrinsic perpendicular magnetization material may include a material having a perpendicular magnetization property in the absence of an external factor. The intrinsic perpendicular magnetization material may include one or more of a perpendicular magnetic material (e.g., CoFeTb, CoFeGd, CoFeDy), a perpendicular magnetic material having an $L_{10}$ structure, CoPt of a hexagonal close packed (HCP) lattice structure, and a perpendicular magnetization structure. The perpendicular magnetic material having the $L_{10}$ structure may include one or more of FePt of the $L_{10}$ structure, FePd of the $L_{10}$ structure, CoPd of the $L_{10}$ structure, and CoPt of the $L_{10}$ structure. The perpendicular magnetization structure may include magnetic layers and non-magnetic layers that are alternately and repeatedly stacked. For example, the perpendicular magnetization structure may include one or more of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where, n is the number of stacked pairs of layers). The extrinsic perpendicular magnetization material may include a material having an intrinsic horizontal magnetization property or a perpendicular magnetization property caused by an external factor. For example, the extrinsic perpendicular magnetization material may have the perpendicular magnetization property caused by magnetic anisotropy induced by a junction between the tunnel barrier pattern TBR and the reference magnetic pattern PL (or the free magnetic pattern FL). The extrinsic perpendicular magnetization material may include, for example, CoFeB.

The line pattern 110 may be disposed below the magnetic tunnel junction pattern MTJ. For example, the line pattern 110 may be interposed between the substrate 100 and the magnetic tunnel junction pattern MTJ. The line pattern 110 may have a linear shape extending in a first direction D1 parallel to a top surface 100U of the substrate 100.

The line pattern 110 may include a topological insulator. The topological insulator may refer to a material that behaves as an insulator in its interior (or bulk) but whose surface contains conducting states in which a current flows along the surface of the material. The line pattern 110 may be configured to have Ovonic threshold switching characteristics such that a surface of the line pattern 110 is in a conducting state when a pulse is applied to the line pattern 110 and the line pattern 110 is in an insulating state as a whole when the pulse is interrupted. For example, when the line pattern 110 is supplied with a voltage less than a threshold voltage, the line pattern 110 may be in an insulating state in which no current flows. Thus, the line pattern 110 may have an off-state. When the line pattern 110 is supplied with a voltage greater than a threshold voltage, a current I may flow through the surface of the line pattern 110 and the surface of the line pattern 110 may be in a conducting state. In this case, the current I may flow along the surface of the line pattern 110, and the line pattern 110 may have an on-state.

In addition, the line pattern 110 may be configured to provide the magnetic tunnel junction pattern MTJ with spin-orbit torque. For example, when the current I flows along the surface of the line pattern 110, the current I may flow close to an interface INF between the line pattern 110 and the magnetic tunnel junction pattern MTJ. The current I may flow parallel to the interface INF between the line pattern 110 and the magnetic tunnel junction pattern MTJ. In this case, a spin current based on spin hall effect (e.g., quantum spin hall effect) may flow in a perpendicular direction to the interface INF, and as a result, the magnetic tunnel junction pattern MTJ may be provided with the spin-orbit torque. The spin-orbit torque may switch the magnetization direction MDf of the free magnetic pattern FL.

The line pattern 110 may include a chalcogen-based topological insulator. The line pattern 110 may include a compound in which a chalcogen element is combined with one or more of silicon (Si), germanium (Ge), bismuth (Bi), and antimony (Sb). The line pattern 110 may include a compound in which at least one of chalcogen elements such as tellurium (Te) and selenium (Se), is combined with one or more of silicon (Si), germanium (Ge), bismuth (Bi), and antimony (Sb). The line pattern 110 may include, for example, one or more of GeSe, BiSe, BiSbTe, GeTe, GeTeSe, GeSbTe, SiTe, and SiGeTe.

The line pattern 110 may be provided thereon with lower conductive lines 120 connected to corresponding portions of the line pattern 110. The lower conductive lines 120 may be spaced apart from each other in the first direction D1, and may extend in a second direction D2 that is parallel to the top surface 100U of the substrate 100 and different from the first direction D1. The lower conductive lines 120 may be disposed to cross over the line pattern 110. When viewed in plan, the magnetic tunnel junction pattern MTJ may be disposed between the lower conductive lines 120. One of the lower conductive lines 120 may be disposed on one side of the magnetic tunnel junction pattern MTJ, and other one of the lower conductive lines 120 may be disposed on other side of the magnetic tunnel junction pattern MTJ. The lower conductive lines 120 may include, for example, metal.

The substrate 100 may be provided thereon with an interlayer dielectric layer 130 covering the line pattern 110, the lower conductive lines 120, and the magnetic tunnel junction pattern MTJ. The interlayer dielectric layer 130 may cover a lateral surface of the magnetic tunnel junction pattern MTJ and expose a top surface of the magnetic tunnel junction pattern MTJ. The interlayer dielectric layer 130 may include one or more of oxide, nitride, and oxynitride.

An upper conductive line 140 may be disposed on the interlayer dielectric layer 130 and connected to the magnetic tunnel junction pattern MTJ. The upper conductive line 140 may extend in the first direction D1 and may be disposed to cross over the lower conductive lines 120. The lower conductive lines 120 may be positioned at a height from the substrate 100 less than that of the upper conductive line 140. For example, the lower conductive lines 120 may be positioned under the upper conductive line 140. The upper conductive line 140 may include, for example, metal.

According to some example embodiments of the present inventive concepts, the line pattern 110 may be configured to have Ovonic threshold switching characteristics and also to provide the magnetic tunnel junction pattern MTJ with spin-orbit torque. For example, the current I may selectively flow through the surface of the line pattern 110 depending on the magnitude of a voltage applied to the line pattern 110, and the current I that flows through the surface of the line pattern 110 may generate the spin-orbit torque applied to the magnetic tunnel junction pattern MTJ. Because the line pattern 110 is configured to have Ovonic threshold switching characteristics, no transistor may be separately required to control current flows through the line pattern 110. Accordingly, the present inventive concepts may provide a spin-orbit torque based magnetic memory device capable of high integration.

Figure 3:
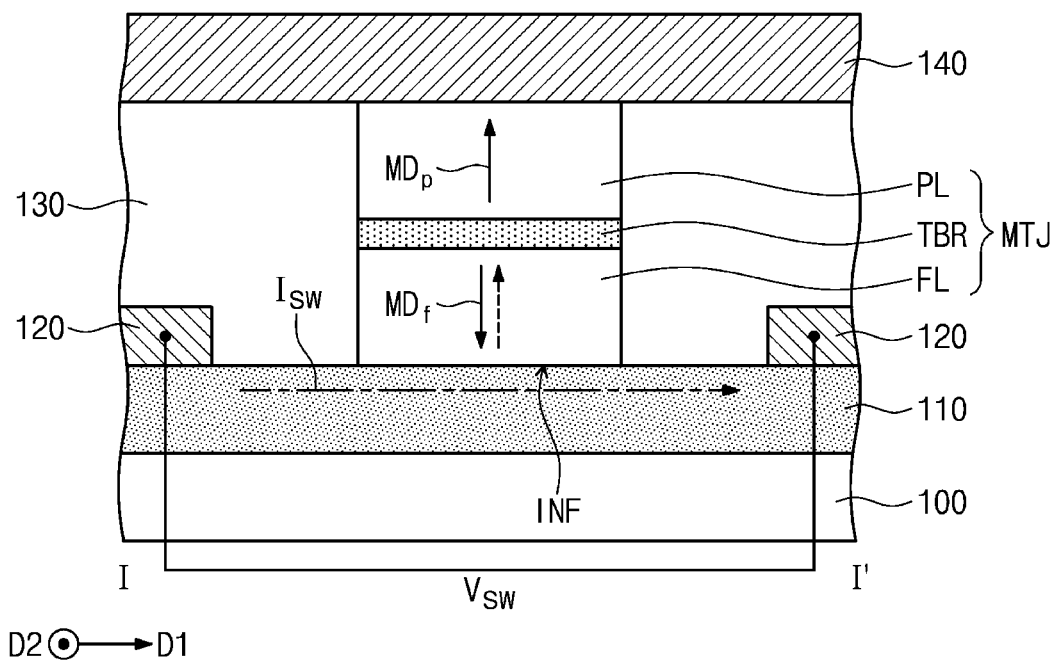
FIGS. 3 and 4 illustrate conceptual views respectively showing write and erase operations of the magnetic memory device depicted in FIG. 2.
Figure 4:
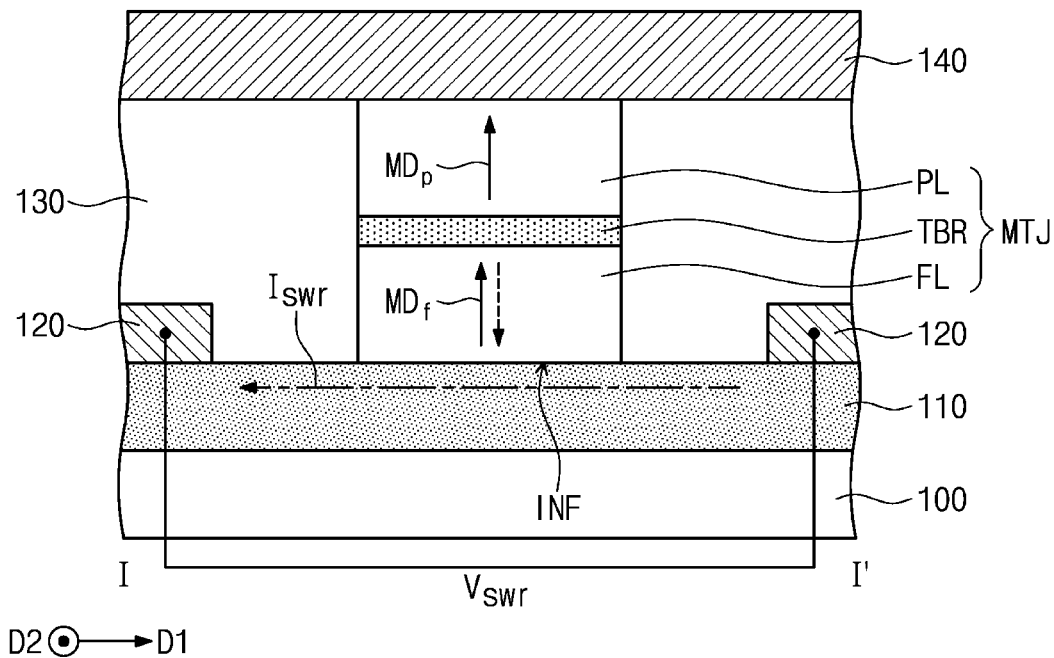

FIGS. 3 and 4 illustrate conceptual views respectively showing write and erase operations of the magnetic memory device depicted in FIG. 2.

Referring to FIG. 3, a write operation of the magnetic tunnel junction pattern MTJ may be performed based on Ovonic threshold switching of the line pattern 110 and spin-orbit torque generated from the current I that flows through the surface of the line pattern 110. For example, a write voltage Vsw may be applied through the lower conductive lines 120 to the line pattern 110. The write voltage Vsw may be greater than a threshold voltage Vth of the line pattern 110, i.e., Vsw>Vth, and accordingly, a write current Isw may flow in the first direction D1 through the line pattern 110. The write current Isw may flow along the surface of the line pattern 110, and the line pattern 110 may be in an on-state. The write current Isw may flow close to and parallel to the interface INF between the line pattern 110 and the magnetic tunnel junction pattern MTJ. In this case, a spin current based on spin hall effect (e.g., quantum spin hall effect) may flow in a perpendicular direction to the interface INF, and as a result, the magnetic tunnel junction pattern MTJ may be provided with the spin-orbit torque. Due to the spin-orbit torque generated by the write current Isw, the magnetization direction MDf of the free magnetic pattern FL may be switched anti-parallel (or parallel) to the magnetization direction MDp of the reference magnetic pattern PL.

Referring to FIG. 4, an erase operation of the magnetic tunnel junction pattern MTJ may be performed based on Ovonic threshold switching of the line pattern 110 and spin-orbit torque generated from the current I that flows through the surface of the line pattern 110. For example, an erase voltage Vswr may be applied through the lower conductive lines 120 to the line pattern 110. The erase voltage Vswr may be a voltage in a reverse direction to that of the write voltage Vsw. The erase voltage Vswr may be greater than the threshold voltage Vth of the line pattern 110, i.e., Vswr>Vth, and accordingly, an erase current Iswr may flow in an opposite direction to the first direction D1 through the line pattern 110. For example, the erase current Iswr may be a current in a reverse direction to that of the write current Isw. The erase current Iswr may flow along the surface of the line pattern 110, and the line pattern 110 may be in an on-state. The erase current Iswr may flow close to and parallel to the interface INF between the line pattern 110 and the magnetic tunnel junction pattern MTJ. In this case, a spin current based on spin hall effect (e.g., quantum spin hall effect) may flow in a perpendicular direction to the interface INF, and as a result, the magnetic tunnel junction pattern MTJ may be provided with the spin-orbit torque. The spin-orbit torque generated by the erase current Iswr may be oriented in a reverse direction to that of the spin-orbit torque generated by the write current Isw. Due to the spin-orbit torque generated by the erase current Iswr, the magnetization direction MDf of the free magnetic pattern FL may be switched parallel (or anti-parallel) to the magnetization direction MDp of the reference magnetic pattern PL.

Figure 5:
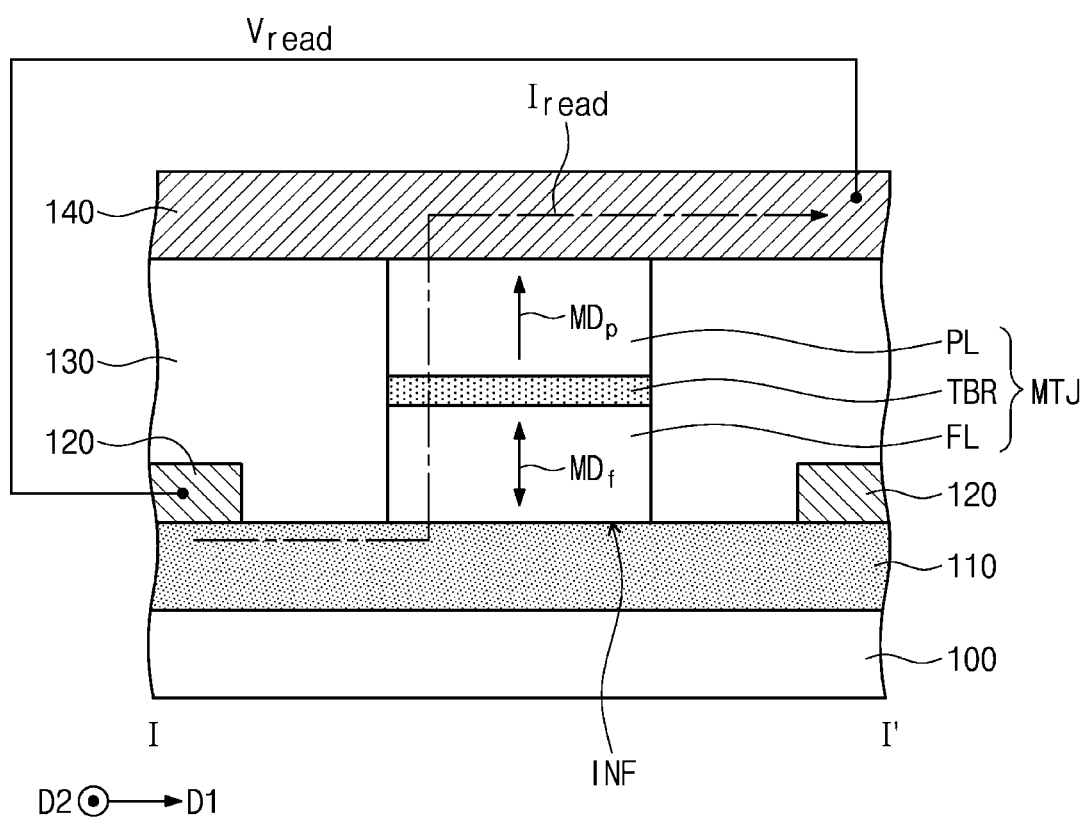
FIG. 5 illustrates a conceptual view showing a read operation of the magnetic memory device depicted in FIG. 2.
Figure 6:
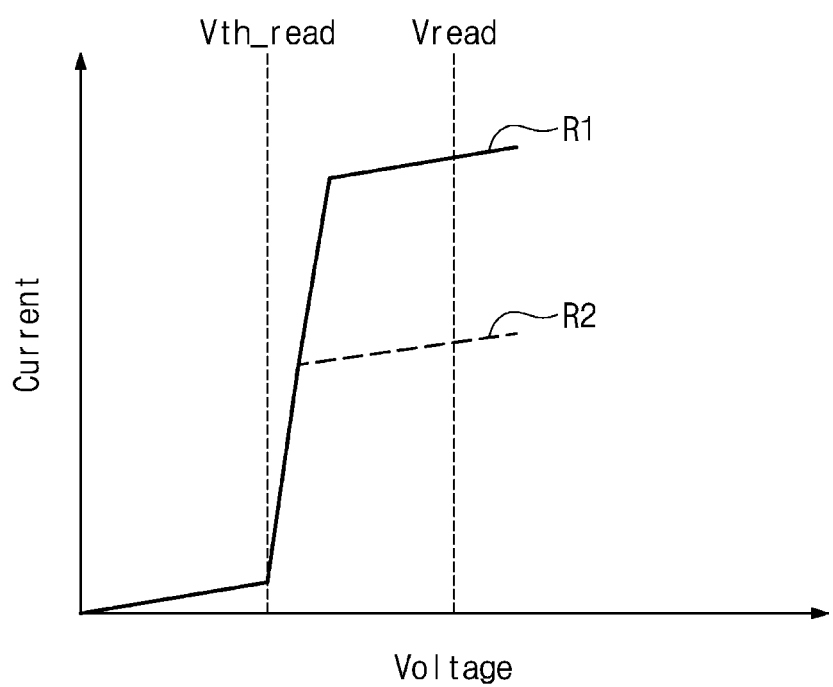
FIG. 6 illustrates a conceptual view showing a read operation of the magnetic memory device depicted in FIG. 2.

FIG. 5 illustrates a conceptual view showing a read operation of the magnetic memory device depicted in FIG. 2. FIG. 6 illustrates a conceptual view showing a read operation of the magnetic memory device depicted in FIG. 2.

Referring to FIGS. 5 and 6, a read voltage Vread may be applied to the upper conductive line 140 and one of the lower conductive lines 120. A threshold voltage Vth_read of the line pattern 110 in a read operation may be less than the threshold voltage Vth of the line pattern 110 in the write or erase operation, i.e., Vth_read<Vth. This may be caused by the fact that a current path within the line pattern 110 in the read operation is shorter than a current path within the line pattern 110 in the write or erase operation. The read voltage Vread may be greater than the threshold voltage Vth_read of the line pattern 110 in the read operation, i.e., Vread>Vth_read, and accordingly, a read current Iread may flow through the magnetic tunnel junction pattern MTJ and a portion of the line pattern 110. The read voltage Vread may be less than the write voltage Vsw and the erase voltage Vswr. The read current Iread may flow through the magnetic tunnel junction pattern MTJ along a perpendicular direction to the interface INF between the line pattern 110 and the magnetic tunnel junction pattern MTJ. The flowing of the read current Iread may be controlled by Ovonic threshold switching characteristics of the line pattern 110.

The read current Iread may detect a resistance state of the magnetic tunnel junction pattern MTJ. The read current Iread may detect whether the magnetic tunnel junction pattern MTJ is either in a high resistance state or in a low resistance state. For example, when the magnetization direction MDf of the free magnetic pattern FL is parallel to the magnetization direction MDp of the reference magnetic pattern PL, the magnetic tunnel junction pattern MTJ may be in a first resistance state R1 (e.g., low resistance state). For example, when the magnetization direction MDf of the free magnetic pattern FL is anti-parallel to the magnetization direction MDp of the reference magnetic pattern PL, the magnetic tunnel junction pattern MTJ may be in a second resistance state R2 (e.g., high resistance state). Data (e.g., "0" or "1") stored in the magnetic tunnel junction pattern MTJ may be detected based on the resistance state (i.e., a magnitude of the read current Iread) of the magnetic tunnel junction pattern MTJ.

Figure 7A:
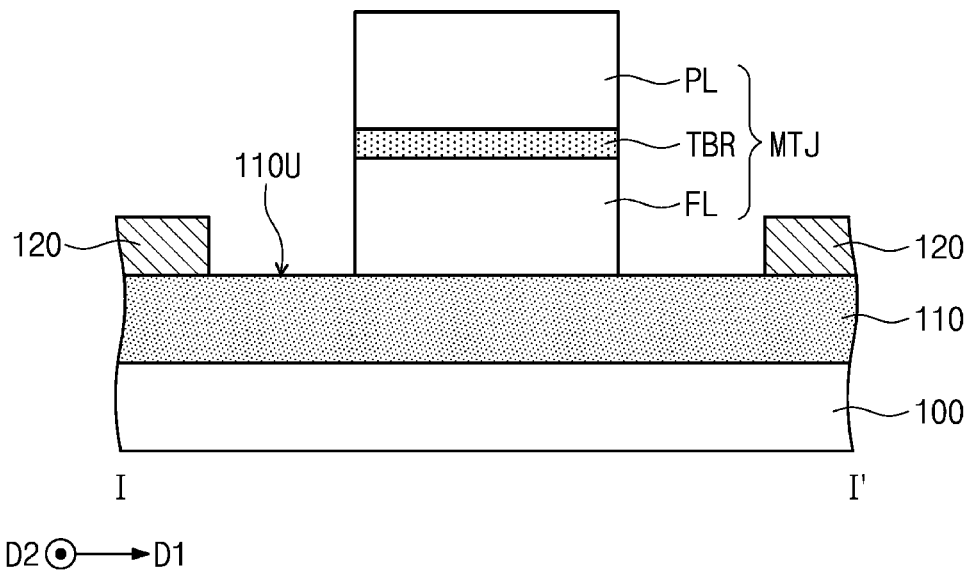
FIGS. 7A and 7B illustrate cross-sectional views taken along line I-I' of FIG. 1, showing a method of fabricating a magnetic memory device according to some example embodiments of the present inventive concepts.
Figure 7B:
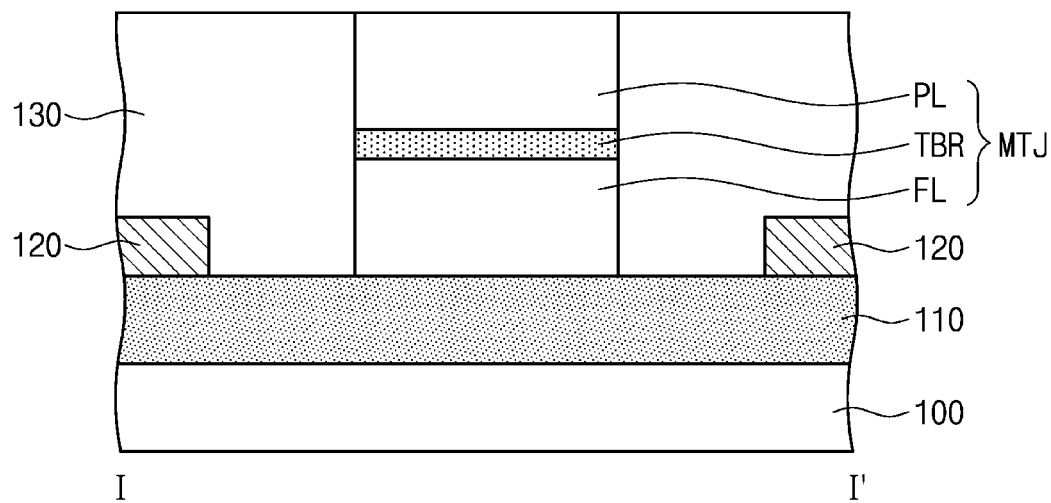

FIGS. 7A and 7B illustrate cross-sectional views taken along line IT of FIG. 1, showing a method of fabricating a magnetic memory device according to some example embodiments of the present inventive concepts. For brevity of description, omission will be made to avoid duplicate explanation of the magnetic memory device discussed with reference to FIGS. 1 and 2.

Referring to FIGS. 1 and 7A, a line pattern 110 may be formed on a substrate 100. The line pattern 110 may be formed to have a linear shape extending in a first direction D1. The line pattern 110 may be formed, for example, by forming a thin layer on the substrate 100 and patterning the thin layer. The thin layer may be formed by performing a deposition process, such as sputtering deposition or chemical vapor deposition. The line pattern 110 may be formed to include, for example, a chalcogen-based topological insulator. Although not shown, a dielectric layer may be formed to cover the line pattern 110 on the substrate 100, and the dielectric layer may expose a top surface 110U of the line pattern 110.

Lower conductive lines 120 may be formed on the line pattern 110. The lower conductive lines 120 may be spaced apart from each other in the first direction D1. Each of the lower conductive lines 120 may be formed to have a linear shape extending in a second direction D2 different from the first direction D1. The lower conductive lines 120 may be formed to cross over the line pattern 110.

A magnetic tunnel junction pattern MTJ may be formed on the line pattern 110. The magnetic tunnel junction pattern MTJ may contact the top surface 110U of the line pattern 110. When viewed in plan, the magnetic tunnel junction pattern MTJ may be disposed between the lower conductive lines 120.

The formation of the magnetic tunnel junction pattern MTJ may include forming on the substrate 100 a magnetic tunnel junction layer covering the top surface 110U of the line pattern 110, forming a mask pattern on the magnetic tunnel junction layer, and etching the magnetic tunnel junction layer using the mask pattern as an etching mask to form the magnetic tunnel junction pattern MTJ. The magnetic tunnel junction layer may include a free magnetic layer, a tunnel barrier layer, and a reference magnetic layer that sequentially cover the top surface 110U of the line pattern 110. Each of the free magnetic layer and the reference magnetic layer may include at least one magnetic layer. Each of the free magnetic layer, the tunnel barrier layer, and the reference magnetic layer may be formed by sputtering deposition or chemical vapor deposition. The mask pattern may define, on the magnetic tunnel junction layer, a location on which the magnetic tunnel junction pattern MTJ is to be formed. The mask pattern may include one or more of metal (e.g., Ta, W, Ru, or Ir), conductive metal nitride (e.g, TiN), oxide, nitride, and oxynitride. The magnetic tunnel junction layer may be etched by an ion beam etching process that uses an ion beam. The ion beam may include, for example, positive argon ions (Ar$^+$). The mask pattern may be used as an etching mask during the ion beam etching process. In certain embodiments, at least a portion of the mask pattern may remain on the magnetic tunnel junction pattern MTJ after the ion beam etching process is completed, but the present inventive concepts are not limited thereto. In other embodiments, the mask pattern may be removed after the ion beam etching process.

The magnetic tunnel junction pattern MTJ may include a free magnetic pattern FL, a tunnel barrier pattern TBR, and a reference magnetic pattern FL that are sequentially stacked on the top surface 110U of the line pattern 110. In certain embodiments, the free magnetic pattern FL may be formed between the tunnel barrier pattern TBR and the line pattern 110, and in this case, the free magnetic pattern FL may contact the top surface 110U of the line pattern 110. When the ion beam etching process is performed, the free magnetic layer, the tunnel barrier layer, and the reference magnetic layer may be etched into the free magnetic pattern FL, the tunnel barrier pattern TBR, and the reference magnetic pattern PL, respectively.

Referring to FIGS. 1 and 7B, an interlayer dielectric layer 130 may be formed on the substrate 100 to cover the line pattern 110, the lower conductive lines 120, and the magnetic tunnel junction pattern MTJ. The interlayer dielectric layer 130 may be formed to expose a top surface of the magnetic tunnel junction pattern MTJ. The interlayer dielectric layer 130 may include one or more of oxide, nitride, and oxynitride.

Referring back to FIGS. 1 and 2, an upper conductive line 140 may be formed on the interlayer dielectric layer 130 and connected to the magnetic tunnel junction pattern MTJ. The upper conductive line 140 may be formed to have a linear shape extending in the first direction D1. The upper conductive line 140 may be formed to intersect the lower conductive lines 120.

Figure 8:
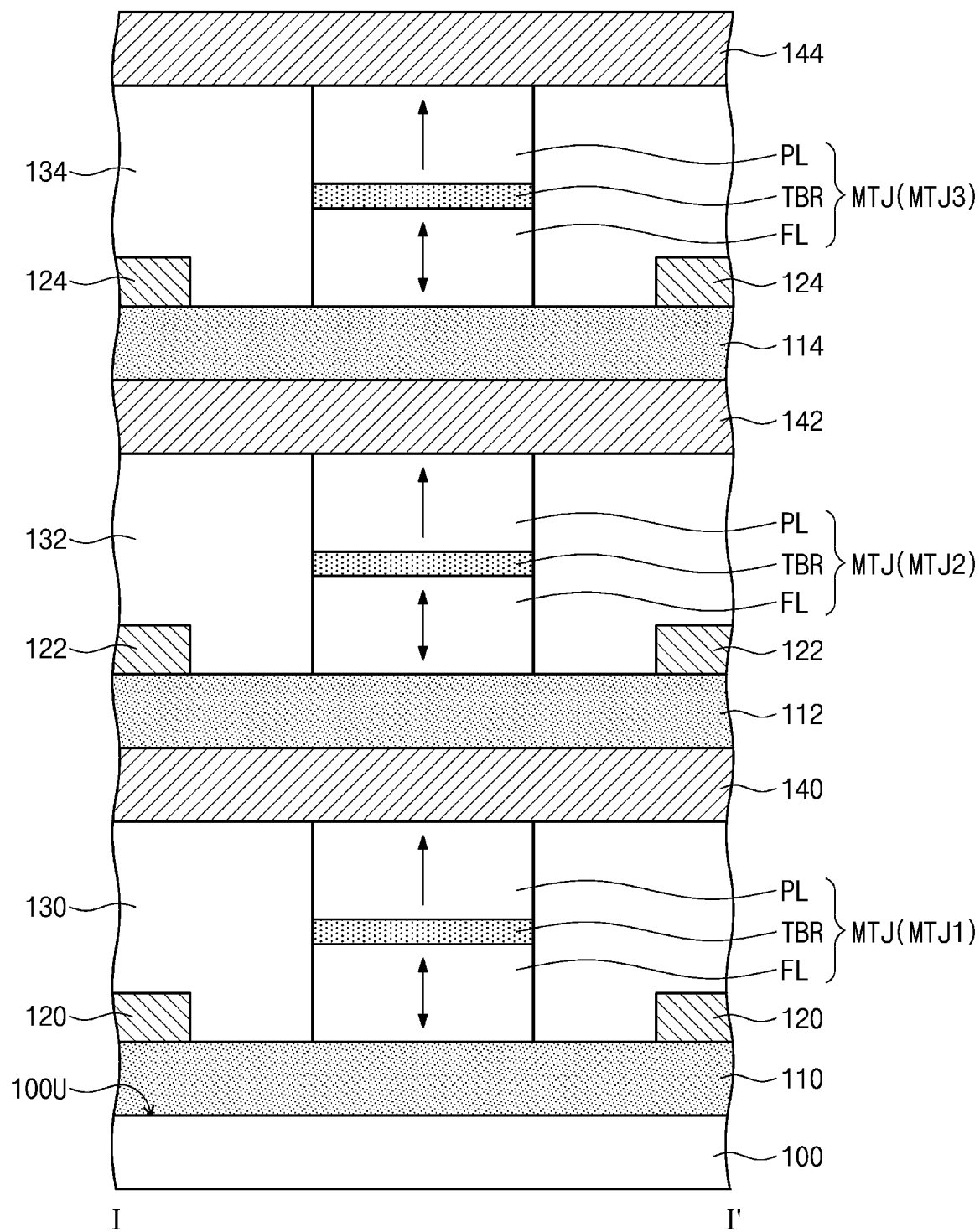
FIG. 8 illustrates a cross-sectional view taken along line I-I' of FIG. 1, showing a magnetic memory device according to some example embodiments of the present inventive concepts.

FIG. 8 illustrates a cross-sectional view taken along line I-I' of FIG. 1, showing a magnetic memory device according to some example embodiments of the present inventive concepts. For brevity of description, omission will be made to avoid duplicate explanation of the magnetic memory device discussed with reference to FIGS. 1 and 2.

Referring to FIGS. 1 and 8, a plurality of magnetic tunnel junction patterns MTJ may be vertically stacked on a substrate 100. The plurality of magnetic tunnel junction patterns MTJ may include a first magnetic tunnel junction pattern MTJ1, a second magnetic tunnel junction pattern MTJ2, and a third magnetic tunnel junction pattern MTJ3 that are sequentially stacked in a perpendicular direction to a top surface 100U of the substrate 100. For convenience of description, three magnetic tunnel junction patterns MTJ are stacked on the substrate 100, but the present inventive concepts are not limited thereto. Each of the first, second, and third magnetic tunnel junction patterns MTJ1, MTJ2, and MTJ3 may include a reference magnetic pattern PL, a free magnetic pattern FL, and a tunnel barrier pattern TBR between the reference magnetic pattern PL and the free magnetic pattern FL. The reference magnetic pattern PL, the free magnetic pattern FL, and the tunnel barrier pattern TBR may be substantially the same respectively as the reference magnetic pattern PL, the free magnetic pattern FL, and the tunnel barrier pattern TBR that are discussed with reference to FIGS. 1 and 2.

A first line pattern 110 may be disposed between the substrate 100 and the first magnetic tunnel junction pattern MTJ1. The first line pattern 110 may have a linear shape extending in a first direction D1. The first line pattern 110 may be substantially the same as the line pattern 110 discussed with reference to FIGS. 1 and 2. For example, the first line pattern 110 may be configured to have Ovonic Threshold Switching characteristics and also to provide the first magnetic tunnel junction pattern MTJ1 with spin-orbit torque. When the first line pattern 110 is supplied with a voltage greater than a threshold voltage, a current may flow through a surface of the first line pattern 110, and the first line pattern 110 may provide the first magnetic tunnel junction pattern MTJ1 with spin-orbit torque. When the first line pattern 110 is supplied with a voltage less than a threshold voltage, no current may flow through the first line pattern 110, and the first line pattern 110 may serve as a dielectric layer for electrical insulation between the substrate 100 and the first magnetic tunnel junction pattern MTJ1.

The first line pattern 110 may be provided thereon with first lower conductive lines 120 connected to corresponding portions of the first line pattern 110. The first lower conductive lines 120 may be spaced apart from each other in the first direction D1 and may extend in a second direction D2 different from the first direction D1. The first lower conductive lines 120 may be disposed to cross over the first line pattern 110. When viewed in plan, the first magnetic tunnel junction pattern MTJ1 may be disposed between the first lower conductive lines 120. One of the first lower conductive lines 120 may be disposed on one side of the first magnetic tunnel junction pattern MTJ1, and other one of the first lower conductive lines 120 may be disposed on other side of the first magnetic tunnel junction pattern MTJ1. The first lower conductive lines 120 may be substantially the same as the lower conductive lines 120 discussed with reference to FIGS. 1 and 2. For example, when the first line pattern 110 is supplied with the voltage greater than the threshold voltage, the voltage may be applied through the first lower conductive lines 120 to the first line pattern 110, and the current may flow through the surface of the first line pattern 110, which is adjacent to the first lower conductive lines 120. In this case, a portion of the first line pattern 110, which is adjacent to the substrate 100, may serve as a dielectric layer for electrical insulation from the substrate 100.

The substrate 100 may be provided thereon with a first interlayer dielectric layer 130 covering the first line pattern 110, the first lower conductive lines 120, and the first magnetic tunnel junction pattern MTJ1. The first interlayer dielectric layer 130 may cover a lateral surface of the first magnetic tunnel junction pattern MTJ1 and expose a top surface of the first magnetic tunnel junction pattern MTJ1. The first interlayer dielectric layer 130 may be substantially the same as the interlayer dielectric layer 130 discussed with reference to FIGS. 1 and 2.

A first upper conductive line 140 may be disposed on the first interlayer dielectric layer 130 and connected to the first magnetic tunnel junction pattern MTJ1. The first upper conductive line 140 may extend in the first direction D1 and may be disposed to cross over the first lower conductive lines 120. The first upper conductive lines 140 may be substantially the same as the upper conductive line 140 discussed with reference to FIGS. 1 and 2.

A second line pattern 112 may be disposed between the first upper conductive line 140 and the second magnetic tunnel junction pattern MTJ2. The second line pattern 112 may have a linear shape extending in the first direction D1. The second line pattern 112 may be substantially the same as the line pattern 110 discussed with reference to FIGS. 1 and 2. For example, the second line pattern 112 may be configured to have Ovonic Threshold Switching characteristics and also to provide the second magnetic tunnel junction pattern MTJ2 with spin-orbit torque. When the second line pattern 112 is supplied with a voltage greater than a threshold voltage, a current may flow through a surface of the second line pattern 112, and the second line pattern 112 may provide the second magnetic tunnel junction pattern MTJ2 with spin-orbit torque. When the second line pattern 112 is supplied with a voltage less than a threshold voltage, no current may flow through the second line pattern 112, and the second line pattern 112 may serve as a dielectric layer for electrical insulation between the first upper conductive line 140 and the second magnetic tunnel junction pattern MTJ2.

The second line pattern 112 may be provided thereon with second lower conductive lines 122 connected to corresponding portions of the second line pattern 112. The second lower conductive lines 122 may be spaced apart from each other in the first direction D1 and may extend in the second direction D2. The second lower conductive lines 122 may be disposed to cross over the second line pattern 112 and the first upper conductive line 140. When viewed in plan, the second magnetic tunnel junction pattern MTJ2 may be disposed between the second lower conductive lines 122. One of the second lower conductive lines 122 may be disposed on one side of the second magnetic tunnel junction pattern MTJ2, and other one of the second lower conductive lines 122 may be disposed on other side of the second magnetic tunnel junction pattern MTJ2. The second lower conductive lines 122 may be substantially the same as the lower conductive lines 120 discussed with reference to FIGS. 1 and 2. For example, when the second line pattern 112 is supplied with the voltage greater than the threshold voltage, the voltage may be applied through the second lower conductive lines 122 to the second line pattern 112, and the current may flow through the surface of the second line pattern 112, which is adjacent to the second lower conductive lines 122. In this case, a portion of the second line pattern 112, which is adjacent to the first upper conductive line 140, may serve as a dielectric layer for electrical insulation from the first upper conductive line 140.

The substrate 100 may be provided thereon with a second interlayer dielectric layer 132 covering the second line pattern 112, the second lower conductive lines 122, and the second magnetic tunnel junction pattern MTJ2. The second interlayer dielectric layer 132 may cover a lateral surface of the second magnetic tunnel junction pattern MTJ2 and expose a top surface of the second magnetic tunnel junction pattern MTJ2. The second interlayer dielectric layer 132 may be substantially the same as the interlayer dielectric layer 130 discussed with reference to FIGS. 1 and 2.

A second upper conductive line 142 may be disposed on the second interlayer dielectric layer 132 and connected to the second magnetic tunnel junction pattern MTJ2. The second upper conductive line 142 may extend in the first direction D1 and may be disposed to cross over the second lower conductive lines 122. The second upper conductive lines 142 may be substantially the same as the upper conductive line 140 discussed with reference to FIGS. 1 and 2.

A third line pattern 114 may be disposed between the second upper conductive line 142 and the third magnetic tunnel junction pattern MTJ3. The third line pattern 114 may have a linear shape extending in the first direction D1. The third line pattern 114 may be substantially the same as the line pattern 110 discussed with reference to FIGS. 1 and 2. For example, the third line pattern 114 may be configured to have Ovonic Threshold Switching characteristics and also to provide the third magnetic tunnel junction pattern MTJ3 with spin-orbit torque. When the third line pattern 114 is supplied with a voltage greater than a threshold voltage, a current may flow through a surface of the third line pattern 114, and the third line pattern 114 may provide the third magnetic tunnel junction pattern MTJ3 with spin-orbit torque. When the third line pattern 114 is supplied with a voltage less than a threshold voltage, no current may flow through the third line pattern 114, and the third line pattern 114 may serve as a dielectric layer for electrical insulation between the second upper conductive line 142 and the third magnetic tunnel junction pattern MTJ3.

The third line pattern 114 may be provided thereon with third lower conductive lines 124 connected to corresponding portions of the third line pattern 114. The third lower conductive lines 124 may be spaced apart from each other in the first direction D1 and may extend in the second direction D2. The third lower conductive lines 124 may be disposed to cross over the third line pattern 114 and the second upper conductive line 142. When viewed in plan, the third magnetic tunnel junction pattern MTJ3 may be disposed between the third lower conductive lines 124. One of the third lower conductive lines 124 may be disposed on one side of the third magnetic tunnel junction pattern MTJ3, and other one of the third lower conductive lines 124 may be disposed on other side of the third magnetic tunnel junction pattern MTJ3. The third lower conductive lines 124 may be substantially the same as the lower conductive lines 120 discussed with reference to FIGS. 1 and 2. For example, when the third line pattern 114 is supplied with the voltage greater than the threshold voltage, the voltage may be applied through the third lower conductive lines 124 to the third line pattern 114, and the current may flow through the surface of the third line pattern 114, which is adjacent to the third lower conductive lines 124. In this case, a portion of the third line pattern 114, which is adjacent to the second upper conductive line 142, may serve as a dielectric layer for electrical insulation from the second upper conductive line 142.

The substrate 100 may be provided thereon with a third interlayer dielectric layer 134 covering the third line pattern 114, the third lower conductive lines 124, and the third magnetic tunnel junction pattern MTJ3. The third interlayer dielectric layer 134 may cover a lateral surface of the third magnetic tunnel junction pattern MTJ3 and expose a top surface of the third magnetic tunnel junction pattern MTJ3. The third interlayer dielectric layer 134 may be substantially the same as the interlayer dielectric layer 130 discussed with reference to FIGS. 1 and 2.

A third upper conductive line 144 may be disposed on the third interlayer dielectric layer 134 and connected to the third magnetic tunnel junction pattern MTJ3. The third upper conductive line 144 may extend in the first direction D1 and may be disposed to cross over the third lower conductive lines 124. The third upper conductive lines 144 may be substantially the same as the upper conductive line 140 discussed with reference to FIGS. 1 and 2.

According to some example embodiments of the present inventive concepts, the first, second, and third line patterns 110, 112, and 114 may be configured to have Ovonic Threshold Switching characteristics and also to provide spin-orbit torque to the first, second, and third magnetic tunnel junction patterns MTJ1, MTJ2, and MTJ3, respectively. Because the first, second, and third line patterns 110, 112, and 114 are configured to have Ovonic threshold switching characteristics, no transistors may be separately required to control current flowing through the first, second, and third line patterns 110, 112, and 114. Accordingly, the first, second, and third magnetic tunnel junction patterns MTJ1, MTJ2, and MTJ3 may be easily stacked vertically on the substrate 100. In conclusion, it may be easy to achieve a high density integration of spin-orbit torque based magnetic memory devices.

According to the present inventive concepts, it may be possible to achieve a high density integration of spin-orbit torque based magnetic memory devices and provide a method of fabricating the same.

The aforementioned description provides some example embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A magnetic memory device, comprising:
a first line pattern on a substrate;
a first magnetic tunnel junction pattern on a first surface of the first line pattern; and
a first upper conductive line that is spaced apart from the first line pattern across the first magnetic tunnel junction pattern and is connected to the first magnetic tunnel junction pattern,
wherein the first line pattern is configured to provide the first magnetic tunnel junction pattern with spin-orbit torque, and
wherein the first line pattern includes a topological insulator; and
a plurality of lower conductive lines disposed on the first surface of the first line pattern and including a first lower conductive line and a second lower conductive line connected to a first portion of the first line pattern and a second portion thereof, respectively,
wherein the first magnetic tunnel junction pattern is disposed between the first lower conductive line and the second lower conductive line, and
wherein the plurality of lower conductive lines are positioned at a height from the substrate less than that of the first upper conductive line.

2. The magnetic memory device of claim 1,
wherein the first line pattern includes a compound in which a chalcogen element is combined with one or more of silicon (Si), germanium (Ge), bismuth (Bi), and antimony (Sb).

3. The magnetic memory device of claim 1,
wherein a first voltage is applied between the first lower conductive line and the second lower conductive line in a write operation, and
wherein a second voltage is applied between one of the plurality of lower conductive lines and the first upper conductive line in a read operation.

4. The magnetic memory device of claim 3,
wherein when the first voltage is greater than a first threshold voltage, a first current flows from the first lower conductive line to the second lower conductive line through the first line pattern and when the first voltage is smaller than the first threshold voltage, the first line pattern electrically insulates the first magnetic tunnel junction pattern from one of the plurality of lower conductive lines.

5. The magnetic memory device of claim 4,
wherein when the second voltage is greater than a second threshold voltage, a second current flows through the first magnetic tunnel junction pattern to detect a resistance status of thereof, and
wherein the second threshold voltage is lower than the first threshold voltage.

6. The magnetic memory device of claim 1,
wherein the plurality of lower conductive lines are spaced apart from each other in a first direction parallel to a top surface of the substrate and extend in a second direction different from the first direction.

7. The magnetic memory device of claim 6,
wherein the first upper conductive line extends in the first direction and crosses over the plurality of lower conductive lines.

8. The magnetic memory device of claim 1, further comprising:
a second magnetic tunnel junction pattern on the first upper conductive line; and
a second line pattern between the first upper conductive line and the second magnetic tunnel junction pattern,
wherein the second line pattern includes a topological insulator.

9. The magnetic memory device of claim 8,
wherein the second line pattern is configured to provide the second magnetic tunnel junction pattern with spin-orbit torque.

10. The magnetic memory device of claim 8, further comprising:
a second upper conductive line that is spaced apart from the second line pattern across the second magnetic tunnel junction pattern and is connected to the second magnetic tunnel junction pattern,
wherein the first upper conductive line and the second upper conductive line extend in a first direction parallel to a top surface of the substrate.

11. A magnetic memory device, comprising:
a first magnetic tunnel junction pattern and a second magnetic tunnel junction pattern sequentially stacked on a substrate;
a line pattern between a top surface of the first magnetic tunnel junction pattern and a bottom surface of the second magnetic tunnel junction pattern; and
a first upper conductive line that is between the top surface of the first magnetic tunnel junction pattern and a bottom surface of the line pattern and is connected to the first magnetic tunnel junction pattern,
wherein the line pattern is configured to, when the line pattern being applied with a first voltage, provide the second magnetic tunnel junction pattern with spin-orbit torque and, when the line pattern being applied with a second voltage different from the first voltage, electrically insulate the first upper conductive line from the second magnetic tunnel junction pattern.

12. The magnetic memory device of claim 11,
wherein the line pattern includes a compound in which a chalcogen element is combined with one or more of silicon (Si), germanium (Ge), bismuth (Bi), and antimony (Sb).

13. The magnetic memory device of claim 11, further comprising:
a second upper conductive line connected to the second magnetic tunnel junction pattern,
wherein the second magnetic tunnel junction pattern is disposed between the line pattern and the second upper conductive line.

14. The magnetic memory device of claim 13, further comprising:
a plurality of lower conductive lines including a first lower conductive line and a second lower conductive line connected to a first portion of the line pattern and a second portion thereof, respectively,
wherein the second magnetic tunnel junction pattern is disposed between the first lower conductive line and the second lower conductive line.

15. The magnetic memory device of claim 14,
wherein the plurality of lower conductive lines are positioned at a height from the substrate between that of the first upper conductive line and that of the second upper conductive line.

16. The magnetic memory device of claim 15,
wherein the plurality of lower conductive lines are spaced apart from each other in a first direction parallel to a top surface of the substrate and extend in a second direction different from the first direction.

17. The magnetic memory device of claim 16,
wherein the first and second upper conductive lines extend in the first direction and cross over the lower conductive lines.

* * * * *